United States Patent
Schafer (10) Patent No.: US 10,250,283 B1
(45) Date of Patent: Apr. 2, 2019

(54) DIGITAL FREQUENCY LOCKED LOOP FOR WIDEBAND COMMUNICATIONS CHANNELS REQUIRING EXTREME DOPPLER COMPENSATION AND LOW SIGNAL TO NOISE RATIO

(71) Applicant: The United States of America, as represented by the Secretary of the Navy, Washington, DC (US)

(72) Inventor: Neil Schafer, Springfield, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/035,742

(22) Filed: Jul. 16, 2018

(51) Int. Cl.
*H04L 27/06* (2006.01)
*H04B 1/16* (2006.01)
*H04L 27/38* (2006.01)
*H04L 25/02* (2006.01)

(52) U.S. Cl.
CPC ............... *H04B 1/16* (2013.01); *H04L 25/02* (2013.01); *H04L 27/38* (2013.01)

(58) Field of Classification Search
CPC . H04L 25/067; H04L 1/0045; H04L 27/2647; H04L 27/3683; H04B 15/005; H04B 1/709
USPC ......... 375/340, 150, 219, 260, 342; 370/208
See application file for complete search history.

(56) References Cited

U.S. PATENT DOCUMENTS 5,271,034 A 12/1993 Abaunza
7,693,211 B2 4/2010 Wang et al.

| | | | | |
|---|---|---|---|---|
| 2004/0202102 A1* | 10/2004 | Kim | ...................... | H03G 3/3089 370/208 |
| 2009/0129509 A1* | 5/2009 | Choi | ...................... | H04H 40/27 375/326 |
| 2010/0045377 A1* | 2/2010 | Witchard | ................ | G04F 1/005 330/251 |

(Continued)

OTHER PUBLICATIONS

Harris et al., Band Edge Filters Perfomr Non Data-Aided Carrier and Timing Synchronization of Software Defined Radio QAM Receivers, The 15th International Symposium on Wireless Personal Multimedia Communications, Sep. 24, 2012-Sep. 27, 2012, IEEE, Piscataway, NJ, USA.

Primary Examiner — Khai Tran
(74) Attorney, Agent, or Firm — US Naval Research Laboratory; Suresh Koshy (57) ABSTRACT

An apparatus for carrier recovery includes a frequency detector. The frequency detector includes a Fast Fourier Transform processor receiving a complex baseband RF input signal and outputting at least one positive frequency bin output and at least one negative frequency bin output. The frequency detector includes a first accumulator receiving directly or indirectly the at least one positive frequency bin output and outputting a positive frequency band energy estimate. The frequency detector includes a second accumulator receiving directly or indirectly the at least one negative frequency bin output and outputting a negative frequency band energy estimate. The frequency detector includes a subtractor receiving the positive frequency band energy estimate and the negative frequency band energy estimate and outputting an instantaneous frequency error estimate representing a difference between the positive frequency band energy estimate and the negative frequency band energy estimate.

10 Claims, 5 Drawing Sheets

(56) References Cited

U.S. PATENT DOCUMENTS

2013/0156073 A1\* 6/2013 Gunawardena ........ H04B 1/709
                                                      375/150
2018/0241606 A1\* 8/2018 Li ...................... H04L 27/3863

\* cited by examiner

DIGITAL FREQUENCY LOCKED LOOP FOR WIDEBAND COMMUNICATIONS CHANNELS REQUIRING EXTREME DOPPLER COMPENSATION AND LOW SIGNAL TO NOISE RATIO

FIELD OF THE INVENTION

The present invention relates in general to an apparatus for carrier recovery and in particular to an apparatus for carrier recovery including a frequency detector.

BACKGROUND OF THE INVENTION

In many terrestrial-based communications waveforms, frequency offsets—whether caused by hardware imperfections or Doppler caused by relative motion—can generally be assumed to be small. This is due to both the typical rate of motion for most terrestrial-based vehicles, as well as the frequency bands most commonly used to achieve reliable communications. Although these frequency errors can be significant enough to fully degrade successful demodulation, assumptions can be made that reduce the complexity of the error correction. For some simple waveforms, a Phase-Locked Loop or Costas Loop intended to correct phase offsets may be able to compensate for a typically small amount of frequency offset. More complex waveforms, such as Orthogonal Frequency-Division Multiplexing ("OFDM") may require data-aided ("DA") compensation, but typically they assume a frequency offset small enough to still enable accurate detection of their pilot tones.

As the radio frequency ("RF") spectrum becomes more saturated, forcing waveforms into higher bands, the effects of Doppler will be more pronounced. High speed aircraft, such as military jets, communicating at extremely high frequencies, can push the effects of Doppler beyond the limits of compensation by conventional means. Spacecraft may be subjected to the effects of Doppler at several orders of magnitude greater than aircraft. These effects may be so great that the Doppler shift may be several hundred times larger than the bandwidth of the waveform itself. A spacecraft in Low Earth Orbit ("LEO") may transition from one extreme of negative frequency Doppler shift to the other extreme of positive frequency Doppler shift while expecting to maintain a constant communication link at every degree in between. A receiver capable of maintaining the instantaneous bandwidth necessary to observe the entire potential Doppler spectrum will suffer from massive Signal-to-Noise Ratio ("SNR") degradation that may render carrier recovery difficult-to-impossible when exposed to poor channel conditions potentially caused by bad weather.

Existing techniques for Frequency-Locked Loops include the following. The first method (referred hereafter as the "Band Edge" method) is described in *Multirate Signal Processing for Communication Systems* by Fred Harris, especially Section 13.4, "Modem Carrier Recovery," as well as Fred Harris et al., "Band Edge Filters Perform Non Data-Aided Carrier and Timing Synchronization of Software Defined Radio QAM Receivers," Wireless Personal Multimedia Communications (WPMC). The 15th International Symposium on Wireless Personal Multimedia Communications, 24-27 Sep. 2012, pp. 271-275, IEEE, Piscataway, N.J. USA. In essence, the Band Edge method involves streaming the In-phase (I) and Quadrature (Q)components of a complex baseband RF signal in parallel through a positive edge Finite impulse Response ("FIR") filter and a negative edge FIR filter. These filters are designed to represent the derivative of the matched filter of the target waveform. A comparator is used to determine which filter output has the most energy, and, in a simplified description, the difference between the two is directly proportional to the frequency error. By using a loop filter controlled feedback loop, the frequency error drives a numerically controlled oscillator ("NCO") that mixes the error frequency with the incoming waveform to drive the incoming signal to baseband. This method has several advantages: 1) the derived frequency error is directly proportional to the carrier offset; 2) frequency correction can be performed on every new sample of data, allowing for rapid carrier acquisition; 3) the technique can track frequency changes without losing lock, as might occur with changes in relative motion or imperfections in the radio frequency ("RF") front end. However, it has a few disadvantages that make it unsuitable for all occasions: 1) due to the band edge filters' direct relationship with the matched filter, as described, the band edge frequency-locked loop ("FLL") cannot compensate for frequency errors much more than twice the waveform bandwidth; 2) the filters can be modified to track wider frequency errors at the expense of accuracy; 3) at low SNR, the noise element of the signal greatly disrupts the frequency detector's ability to discern the frequency offset of the signal, resulting in an unstable output frequency that can (and does) greatly disrupt further demodulation of the waveform.

The majority of "frequency-locked loops" in the literature actually refer to phase-locked loop "PLLs"), which are useful for driving an input signal to match a specific phase and frequency of a reference signal. Phase-locked loops are versatile, and can correct for minor frequency offsets. In many conventional systems, the frequency error introduced by Doppler is small enough to be corrected by a phase-locked loop with a broad loop bandwidth. In more sophisticated systems, a PLL can be employed with a broad loop bandwidth for coarse frequency correction, and then switch to a narrower loop bandwidth once frequency is acquired. Such techniques are also not suitable of situations in which the frequency offset is several times the bandwidth of the signal or in low SNR environments.

Some techniques involve directly computing Doppler compensation at the receiver or the transmitter via a look-up table or other comparable means. Such techniques are likely the most capable of rapidly synchronizing with a waveform, and may be critical for high data rate, bursty transmissions. These techniques require several assumptions, however. For instance, in these situations, at least one platform is typically immobile. In some situations, such as satellite communications, one platform has a known flight profile which can be used to compensate for Doppler effects through pre-calculations. Other techniques may require a complicated system of direction finding and inertial sensors to calculate the expected Doppler compensation in near-real time. Because a flight profile may not always be known in advance, multiple nodes may be moving, and/or the cost, size, weight, or power requirements to facilitate a more adaptive inertial system may be prohibitive, these techniques are not suitable for all occasions.

BRIEF SUMMARY OF THE INVENTION

An embodiment of the invention includes an apparatus for carrier recovery. The apparatus includes a frequency detector. The frequency detector includes a Discrete Fourier Transform ("DFT") processor (the Fast Fourier Transform ("FFT") being an illustrative implementation thereof) receiving a complex baseband RF input signal and outputting at least one positive frequency bin output and at least one negative frequency bin output. The frequency detector includes a first accumulator receiving directly or indirectly the at least one positive frequency bin output and outputting a positive frequency band energy estimate. The frequency detector includes a second accumulator receiving directly or indirectly the at least one negative frequency bin output and outputting a negative frequency band energy estimate. The frequency detector includes a subtractor receiving the positive frequency band energy estimate and the negative frequency band energy estimate and outputting an instantaneous frequency error estimate representing a difference between the positive frequency band energy estimate and the negative frequency band energy estimate.

An embodiment of the invention including a Frequency-Locked Loop that provides coarse frequency correction under circumstances in which a radio receiver is expected to receive a radio signal at a significant offset from the intended transmission frequency. Correcting for this offset is known as carrier recovery. This embodiment of the invention provides a novel, efficient method and/or apparatus for non-data aided ("NDA"), or "blind," carrier recovery within the digital domain for waveforms that may be subject to potentially extreme and variable frequency error.

An embodiment of the invention provides several benefits. As a first benefit, aspects of an embodiment of the invention relating to frequency offset estimation are relatively low in complexity and can be used in a waveform-agnostic manner. The FFT operation followed by an accumulation and a subtraction uses fewer standard FPGA or standard ASIC resources than two FIR filters, as described in the above-mentioned Band Edge method. The operation can also typically be computed more rapidly when implemented in software than two FIR filters.

As a second benefit, an embodiment of the invention is fairly waveform and bandwidth agnostic. Because the FFT operation may provide frequency information across a large window of time, even frequency modulated waveforms, which may be heavily disruptive to the above-mentioned Band Edge method, are unlikely to disrupt the frequency estimation. Nearly all modulation types, when averaged across time to infinity, create a nearly symmetrical utilization of the signal bandwidth. The combination of a large FFT window and the averaging effect of the loop filter helps this implementation to lock to the long term average frequency offset.

As a third benefit, an embodiment of the invention is significantly more resilient to noise than nearly all methods that use time-domain frequency detection. As SNR levels drop below 6 dB, the magnitude of noise compared to the magnitude of the signal begins to greatly impede a typical frequency detector's ability to function. In the best cases, FLLs exposed to low SNR will begin to "shudder" around the frequency origin, typically preventing further demodulation. In the frequency domain, periodic signals, regardless of SNR, tend to dominate the spectrum. This allows the method used to reliably lock to the center frequency even under harsh conditions.

In view of these benefits, one or more embodiments of the invention is highly advantageous for blind frequency correction under extreme Doppler conditions, in which the Doppler offset may be several times larger than the bandwidth of the target waveform.

DETAILED DESCRIPTION OF THE INVENTION

An embodiment of the invention includes an apparatus for carrier recovery 10, which is described as follows with reference to FIGS. 1-2. The apparatus for carrier recovery 10 includes a frequency detector 20, such as shown by way of example in FIG. 1. The frequency detector 20 includes a standard a Discrete Fourier Transform ("DFT") processor 30 (e.g., a standard, Fast Fourier Transform ("FFT") processor) receiving a standard, complex baseband RF input signal and outputting at least one positive frequency bin output and at least one negative frequency bin output. For example, the complex baseband RF input signal includes an in-phase component and a quadrature component. The frequency detector 20 includes a standard, first accumulator 40 receiving directly or indirectly the at least one positive frequency bin output and outputting a positive frequency band energy estimate. The frequency detector 20 includes a standard, second accumulator 50 receiving directly or indirectly the at least one negative frequency bin output and outputting a negative frequency band energy estimate. The frequency detector 20 includes a standard subtractor 60 receiving the positive frequency band energy estimate and the negative frequency band energy estimate and outputting an instantaneous frequency error estimate representing a difference between the positive frequency band energy estimate and the negative frequency band energy estimate.

Optionally, the apparatus for carrier recovery 10 further includes a frequency-locked loop 70. The frequency-locked loop 70 includes the frequency detector 20. The frequency-locked loop 70 includes a standard frequency mixer 80 outputting the complex baseband RF input signal to the frequency detector 20. For example, the frequency mixer 80 includes a standard, voltage controlled oscillator or a standard, numerically controlled oscillator. The frequency-locked loop 70 includes a standard loop filter 90 receiving the instantaneous frequency error estimate from the frequency detector 20. The loop filter 90 receives a complex baseband RF input signal and based on the instantaneous frequency error estimate generates a smoothed and/or corrected frequency error estimate. The loop filter 90 outputs the smoothed and/or corrected frequency error estimate to the frequency mixer 80. For example, the loop filter 90 includes a standard proportional-integral-derivative loop or a standard Alpha Beta filter.

Optionally, the apparatus for carrier recovery 10 further includes a standard, first magnitude operator 100 receiving the at least one positive frequency bin output and outputting at least one first absolute value. The first accumulator 40 receives the at least one first absolute value from the first magnitude operator 100. The apparatus for carrier recovery 10 further includes a standard, second magnitude operator 110 receiving the at least one negative frequency bin output and outputting at least one second absolute value. The second accumulator 50 receives the at least one second absolute value from the second magnitude operator 110.

Figure 3:
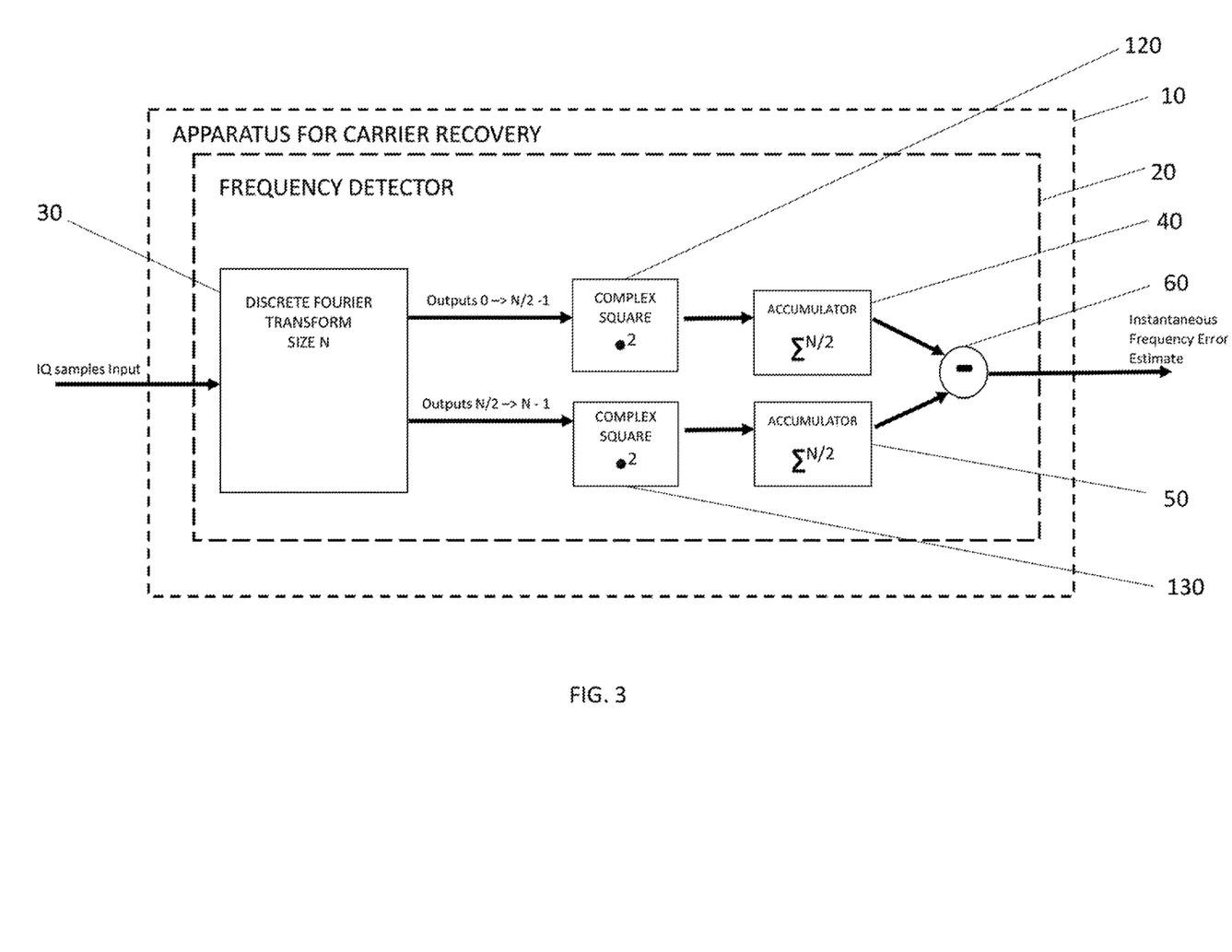
FIG. 3 is an apparatus for carrier recovery including a frequency detector according to another embodiment of the invention, the frequency detector including complex square operators.

Another embodiment of the invention is described as follows with reference to FIG. 3. The embodiment of the invention includes an apparatus for carrier recovery 10 that further includes a standard, first complex square operator 120 receiving the at least one positive frequency bin output and outputting at least one first complex square value. The first complex square operator 120 multiplies the at least one positive frequency bin output by its conjugate to result in at least one positive real value, i.e., the at least one first complex square value. The first accumulator 40 receives the at least one first complex square value from the first complex square operator 120. The apparatus for carrier recovery 10 further includes a standard, second complex square operator 130 receiving the at least one negative frequency bin output and outputting at least one second complex square value. The second accumulator 50 receives the at least one second complex square value from the second complex square operator 130.

Another embodiment of the invention includes an apparatus for carrier recovery 10, and is described as follows with reference to FIGS. 1-2. The apparatus for carrier recovery 10 includes a Frequency-Locked Loop ("FLL") 70, such as shown by way of example in FIG. 2. A received, standard complex baseband RF signal is the input to the FLL 70, wherein the complex baseband is composed of an In-phase (I) component and Quadrature (Q) component of the signal, colloquially known together as IQ. The FLL 70 first acts by mixing the incoming data with the estimated frequency offset. Assuming the frequency offset has been perfectly matched, the result of this operation should be a complex baseband RF signal centered about the complex frequency origin. This corrected complex baseband RF signal is then outputted from the FLL 70 to be interpreted as necessary by the balance of a user's system employed to use the received RF signal.

The corrected complex baseband RF signal is then passed to a frequency detector 20. An embodiment of the frequency detector 20 advantageously is non-use-specific and/or waveform-agnostic. The detected frequency offset is sent to a standard loop filter 90 for smoothing. The loop filter 90 is, for example, a proportional-integral-derivate filter or an Alpha Beta filter, and reduces large impulses in frequency error and smooths the frequency error estimate provided to frequency mixer 80. In this way, the corrected frequency at the frequency mixer 80 is averaged in a standard manner, thereby reducing the amount of shuddering or jittering that may occur at the frequency mixer 80.

Embodiments of the frequency mixer 80 are well known in the art. It, for example, includes a standard, Voltage Controlled Oscillator ("VCO") or a standard, Numerically Controlled Oscillator ("NCO") driven by the frequency correction value from the loop filter 90. The output of the VCO or NCO represents a phase that is multiplied by the incoming signal to translate the incoming signal to the desired frequency or phase.

Figure 1:
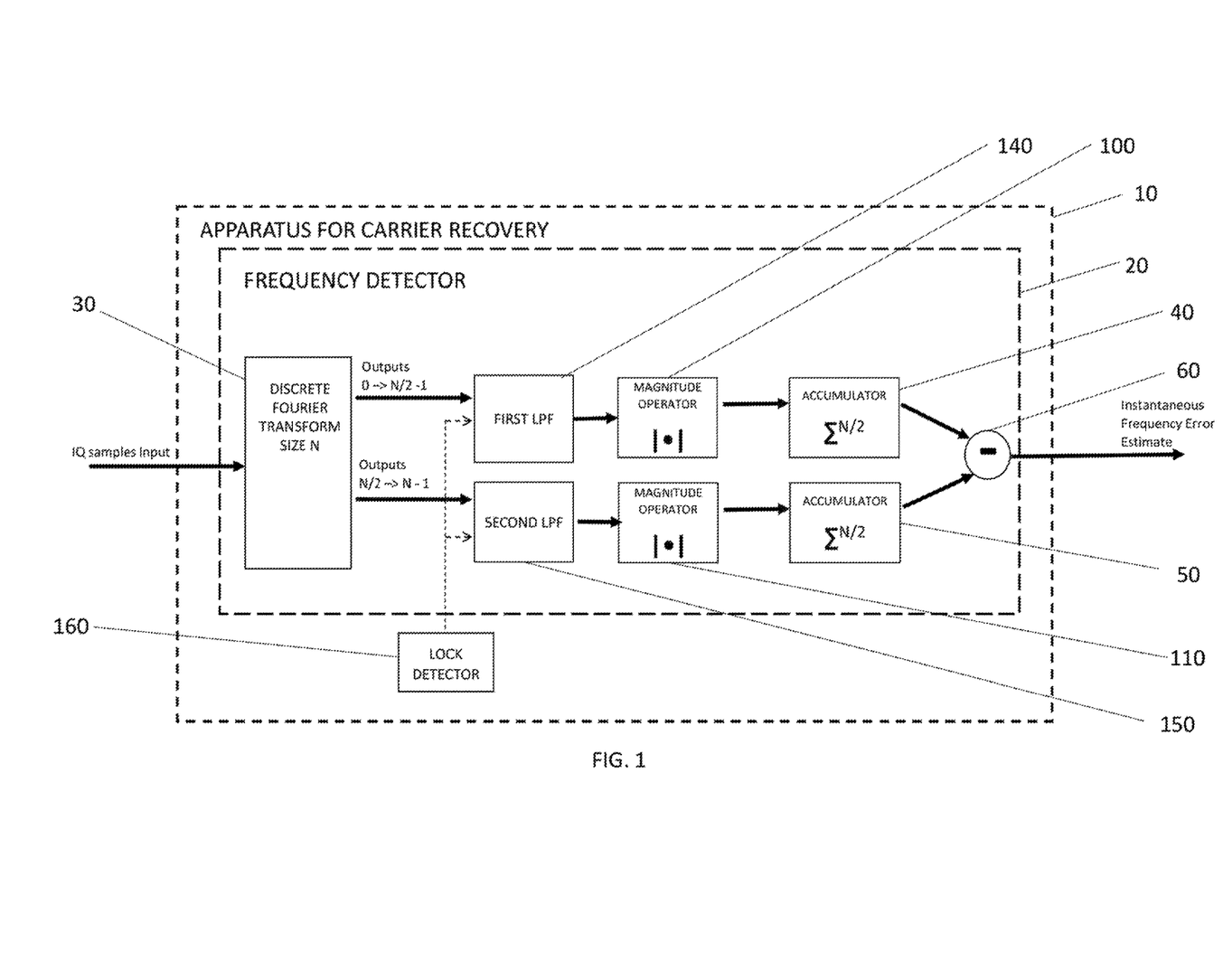
FIG. 1 is an apparatus for carrier recovery including a frequency detector according to an embodiment of the invention.
Figure 2:
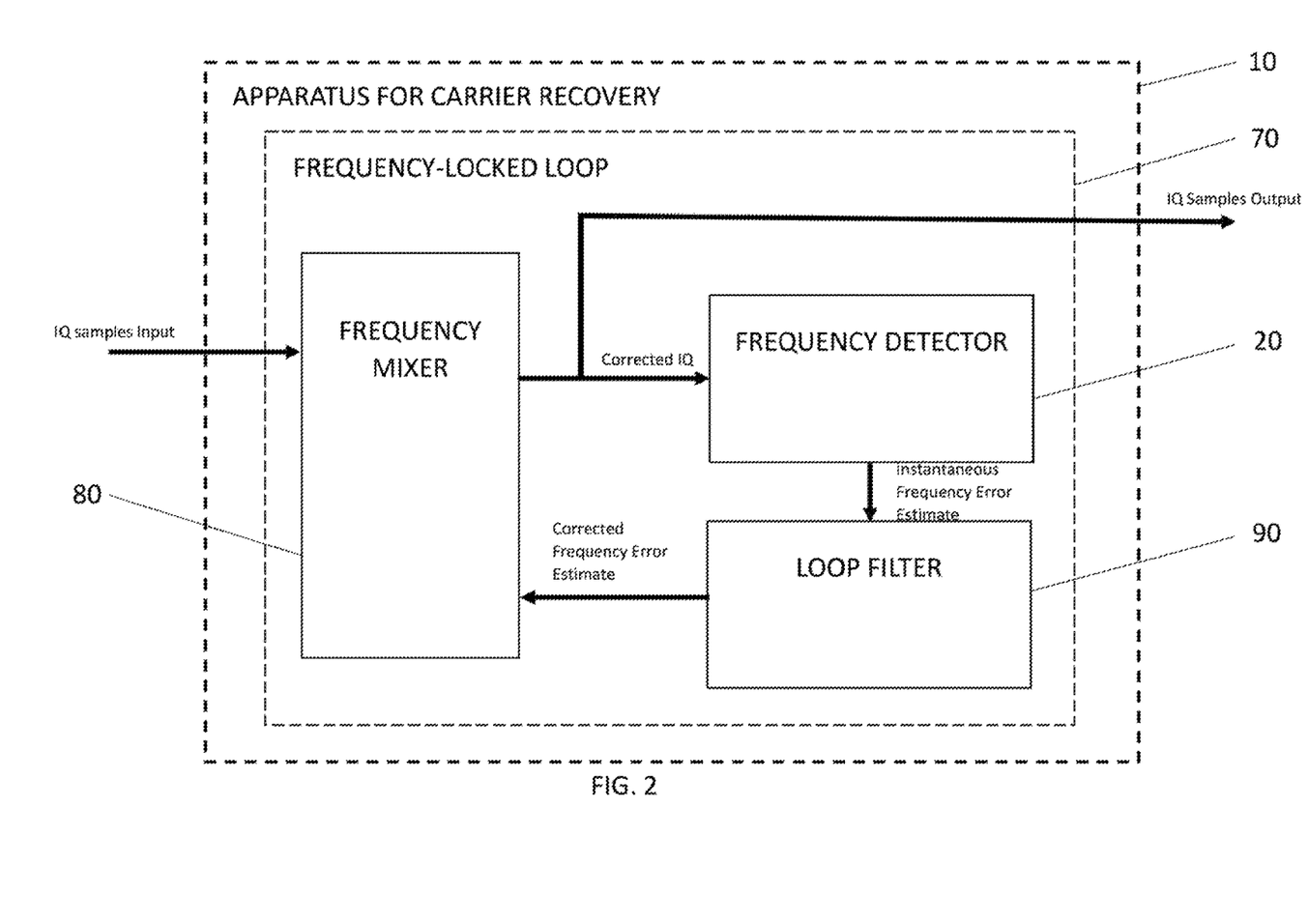
FIG. 2 is an apparatus for carrier recovery including a frequency-locked loop according to another embodiment of the invention.

The frequency detector 20, such as shown by way of example in FIG. 1, includes a standard Fast Fourier Transform processor 30 that is used to calculate the frequency components of the incoming complex baseband RF signal. The presence of sinusoids, even those with poor SNR characteristics, are detectable easily by the FFT 30. The size of the FTT, N, is chosen based on the data rate of the waveform and the requirements of the application. Larger (i.e., as N increases) FFTs provide more resolution while representing a long term representation of frequency components, but tend to achieve lock more slowly. Smaller (i.e., as N decreases) FFTs are less precise, but tend to achieve lock more rapidly and optionally benefit from the natural smoothing provided by the loop filter 90.

The output of the FFT 30 is used to calculate the frequency error of the received waveform. The first N/2 FFT outputs represent frequency components in the positive frequency band of complex baseband, and the second N/2 FFT outputs represent the frequency components of the negative frequency band. By independently summing the magnitude of each "side" of the FFT 30, the total energy contained in the positive frequency band or negative frequency band can be determined. Because Additive White Gaussian Noise ("AWGN") can be assumed to have a proportional effect on both bands, the frequency error is determined by subtracting the accumulated sum of the negative frequency components from the accumulated sum of the positive frequency components using a standard subtractor 60. As the FLL 70 shifts the frequency in the appropriate direction via the NCO or VCO, the bandwidth of the waveform will begin to split both bands evenly, resulting in diminishing frequency error, until the waveform is centered about the complex frequency origin and the frequency error is zero. When the frequency error reaches and maintains a near zero result, the FLL 70 will have achieved lock.

Figure 4:
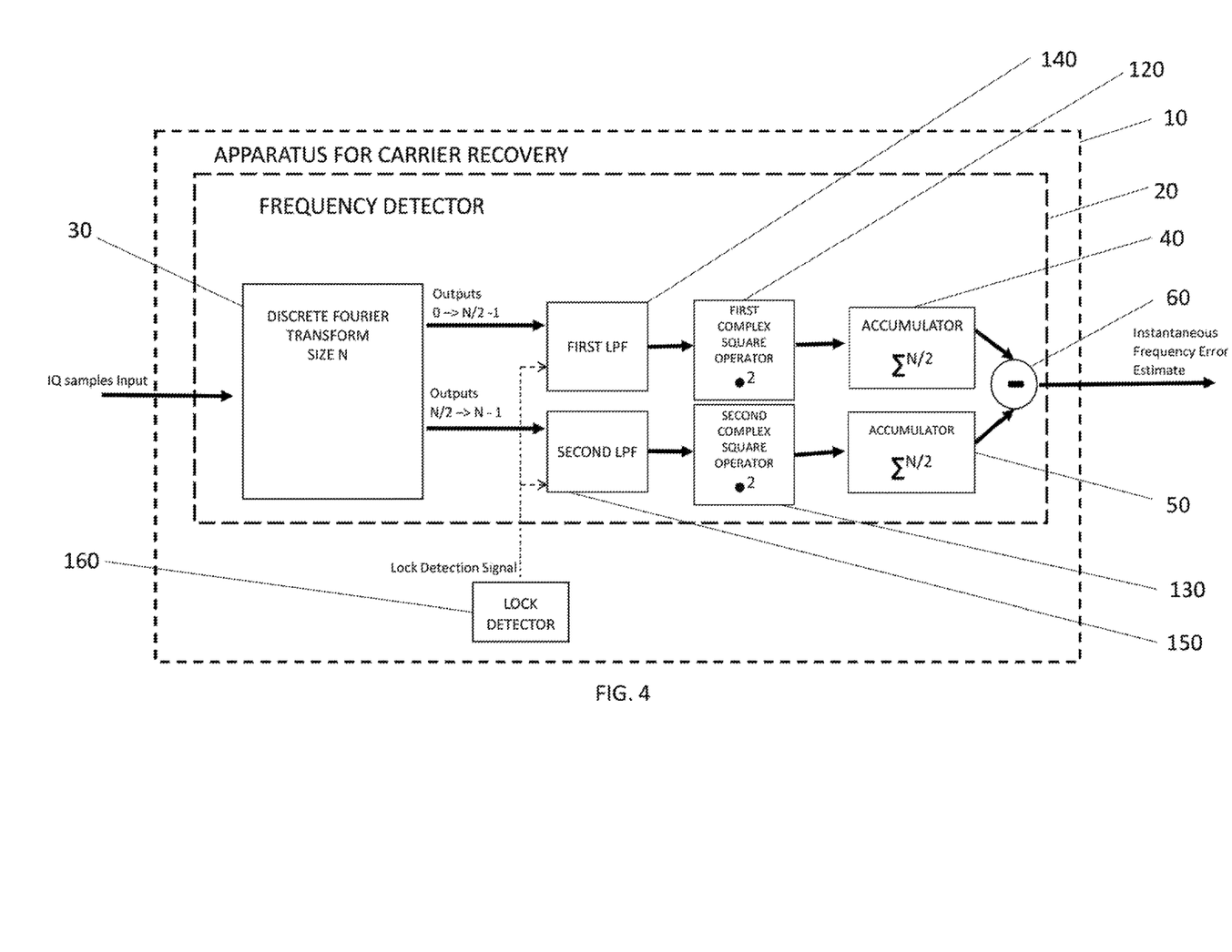
FIG. 4 is an apparatus for carrier recovery including a frequency detector according to another embodiment of the invention, the frequency detector including optional low pass filters communicating with an optional lock detector.

Another embodiment of the invention includes one or more standard frequency-domain low pass filters 140, 150, such as shown in FIG. 4. Such frequency-domain low pass filters are, for example, implemented by zeroing the FFT output bins that represent frequency components outside the largest expected frequency offset. For example, a first frequency-domain low pass filter 140 receives the at least one positive frequency bin output from the FFT 30 and outputs positive frequency components within the largest expected frequency offset to the first magnitude operator 100 in an embodiment such as shown in FIG. 1 (or the first complex square operator in another embodiment such as shown in FIG. 4) For example, a second frequency-domain low pass filter 150 receives the at least one negative frequency bin output from the FFT 30 and outputs negative frequency components within the largest expected frequency offset to the second magnitude operator 110 in an embodiment such as shown in FIG. 1 (or the second complex square operator in another embodiment such as shown in FIG. 4). These filters, for example, reduce deleterious effects of noise outside the immediate bands of interest.

Figure 5:
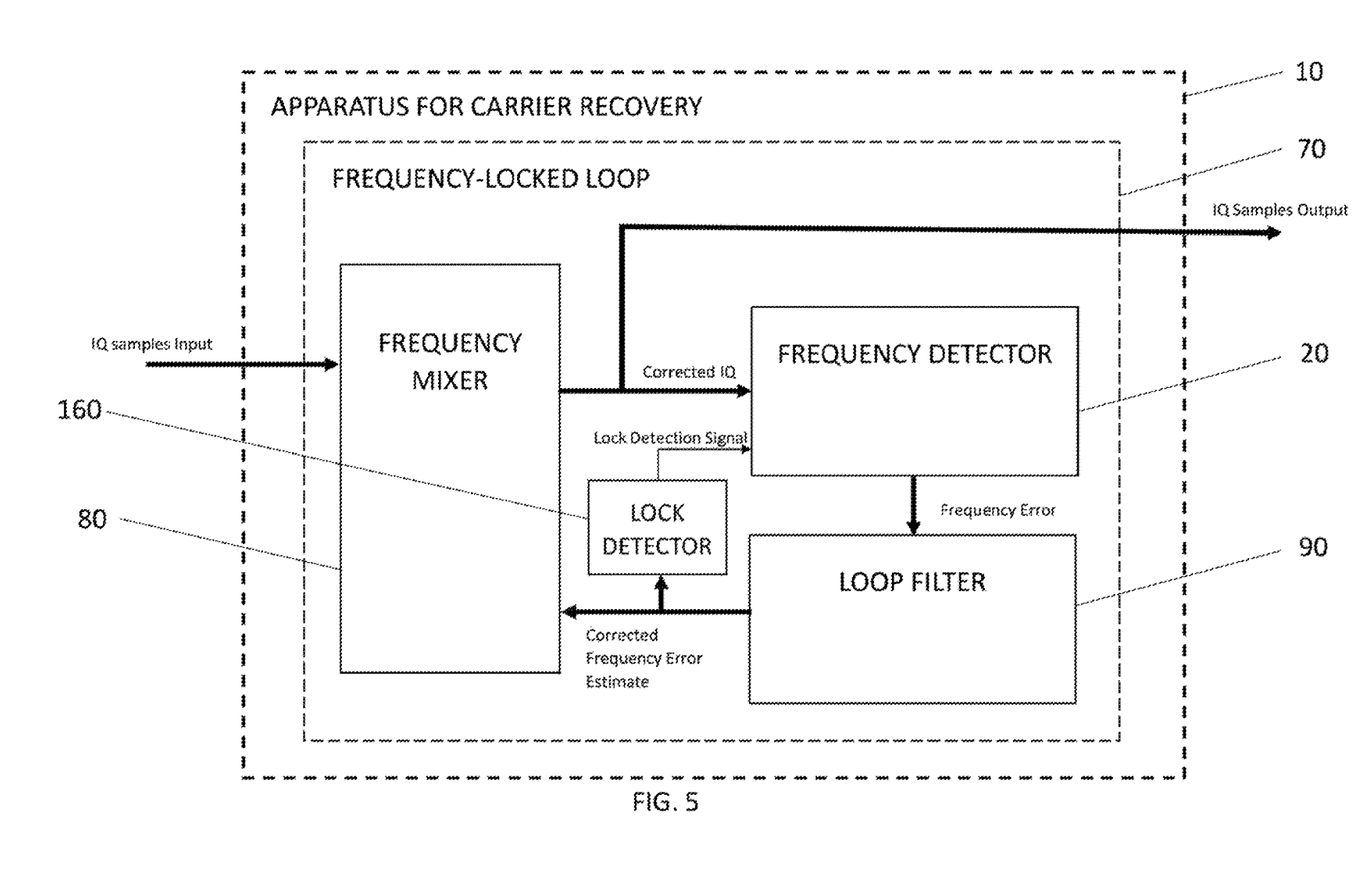
FIG. 5 is an apparatus for carrier recovery including a frequency-locked loop according to another embodiment of the invention, the frequency-locked loop including a lock detector communicating with a frequency detector.

Another embodiment of the invention includes a standard lock detector 160, such as shown in FIGS. 4 and 5. The lock detector 160 functions by sending a "lock" identification signal when the absolute value of the frequency error is less than some predefined amount. When a lock is detected, the frequency-domain low pass filters 140, 150 are, for example, updated to filter out frequency components outside the instantaneous bandwidth of the target waveform. This further reduces noise as well as effectively lowering the bandwidth of the loop filter, improving the overall stability of the FLL 70. The input to the lock detector 160 accepts the corrected frequency error estimate from the output of the loop filter 90, and, for example, provides a single "lock detection" signal to both of the low pass filters 140, 150 to reduce the bandwidth of the low pass filters.

In another embodiment of the invention, the accumulators 40, 50 are weighted in a standard manner, for example, with increased weight given to energy the further away it is from the origin. An example may be a standard exponential weighting, with increased weighting for bins that are furthers from the frequency origin. For example, such a weighting causes the equivalent of increased loop bandwidth the further the waveform is from the origin (increasing the speed of lock), while naturally narrowing the loop bandwidth the closer the FLL 70 is to locking the waveform at the origin (improving the stability of lock).

Another embodiment of the invention detects and compensates for frequency offsets under non-data-aided conditions, adapt to rapid changes in the frequency offsets, do so under conditions in which the waveform is narrow compared to the frequency offset, and may be subject to poor Signal-to-Noise Ratio. The embodiment of the invention is, for example, implemented in standard application-specific integrated circuits ("ASIC"), standard programmable hardware such as field programmable gate array ("FPGA"), or standard software. For example, an embodiment of the invention is a component in a standard modem operated within a standard FPGA.

Although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

This written description sets forth the best mode of the invention and provides examples to describe the invention and to enable a person of ordinary skill in the art to make and use the invention. This written description does not limit the invention to the precise terms set forth. Thus, while the invention has been described in detail with reference to the examples set forth above, those of ordinary skill in the art may effect alterations, modifications and variations to the examples without departing from the scope of the invention.

These and other implementations are within the scope of the following claims.

What is claimed as new and desired to be protected by Letters Patent of the United States is:

1. An apparatus comprising:
   a frequency detector comprising:
   a Fast Fourier Transform processor receiving a complex baseband RF input signal and outputting at least one positive frequency bin output and at least one negative frequency bin output;
   a first accumulator receiving directly or indirectly the at least one positive frequency bin output and outputting a positive frequency band energy estimate;
   a second accumulator receiving directly or indirectly the at least one negatively frequency bin output and outputting a negative frequency band energy estimate; and
   a subtractor receiving the positive frequency band energy estimate and the negative frequency band energy estimate and outputting an instantaneous frequency error estimate representing a difference between the positive frequency band energy estimate and the negative frequency band energy estimate.

2. The apparatus according to claim 1, wherein the complex baseband RF input signal comprises an in-phase component and a quadrature component.

3. The apparatus according to claim 1, further comprising:
   a frequency-locked loop comprising:
   said frequency detector;
   a frequency mixer outputting the complex baseband RF input signal to said frequency detector; and
   a loop filter receiving the instantaneous frequency error estimate from said frequency detector, said loop filter outputting to said frequency mixer a corrected frequency error estimate based on the instantaneous frequency error.

4. The apparatus according to claim 3, wherein said frequency mixer comprises one of a voltage controlled oscillator and a numerically controlled oscillator.

5. The apparatus according to claim 4, wherein said loop filter comprises one of a proportional-integral-derivative loop and an Alpha Beta filter.

6. The apparatus according to claim 3, further comprising:
   a first magnitude operator receiving the at least one positive frequency bin output and outputting at least one first absolute value to said first accumulator; and
   a second magnitude operator receiving the at least one negative frequency bin output and outputting at least one second absolute value to said second accumulator.

7. The apparatus according to claim 6, further comprising:
   a lock detector receiving the corrected frequency error estimate and outputting a lock detection signal to said first magnitude operator and said second magnitude operator.

8. The apparatus according to claim 1, further comprising:
   a first complex square operator receiving one of directly and indirectly the at least one positive frequency bin output and outputting at least one first complex square value to said first accumulator; and
   a second complex square operator receiving one of directly and indirectly the at least one negative frequency bin output and outputting at least one second complex square value to said second accumulator.

9. The apparatus according to claim 8, further comprising:
   a first frequency-domain low pass filter receiving the at least one positive frequency bin output and communicating with said first complex square operator; and
   a second frequency-domain low pass filter receiving the at least one negative frequency bin output and communicating with said second complex square operator.

10. The apparatus according to claim 9, further comprising:
    a lock detector receiving the corrected frequency error estimate and outputting a lock detection signal to said first frequency-domain low pass filter and said second frequency-domain low pass filter.

* * * * *